United States Patent [19]

Merkt et al.

[11] Patent Number: 5,142,771
[45] Date of Patent: Sep. 1, 1992

[54] SPRING POWERED FEEDER FOR FEEDING ELECTRICAL CONNECTOR FROM A TUBE MAGAZINE

[75] Inventors: Steven T. Merkt, New Cumberland; Richard L. Schaeffer, Jr., Carlisle; Dale E. Stough, Jr., Red Lion, all of Pa.

[73] Assignee: AMP Incorporated, Harrisburg, Pa.

[21] Appl. No.: 762,091

[22] Filed: Sep. 18, 1991

[51] Int. Cl.$^5$ .......................... B23P 19/00; B23Q 7/10
[52] U.S. Cl. ......................................... 29/751; 29/809; 221/227; 221/232
[58] Field of Search ............... 29/751, 809; 414/798.9; 221/226, 227, 232, 312 C

[56] References Cited

U.S. PATENT DOCUMENTS

| | | | |
|---|---|---|---|
| 4,599,026 | 7/1986 | Feiber et al. | 414/126 |
| 4,636,126 | 1/1987 | Spotts | 414/126 |
| 4,670,977 | 6/1987 | Scrantom et al. | 29/809 |
| 4,718,531 | 1/1988 | Bianchi et al. | 193/17 |
| 4,862,578 | 9/1989 | Holcomb | 29/564.1 |
| 4,940,163 | 7/1990 | Baillet et al. | 29/809 |

Primary Examiner—P. W. Echols

[57] ABSTRACT

Feeding apparatus for feeding articles, such as electrical devices, from a tube magazine comprises a frame for supporting the tube with a first end of the tube adjacent to a delivery station. The articles are fed by a flexible feeding member which has a first feeding member and located, at the beginning of an operating cycle, adjacent to the second end of the tube. The feeding member extends away from the second end and then in the reverse direction back towards the first end of the tube. The feeding member is moved through the tube by an actuator which comprises a resilient flexible tape or band. The actuator has a coiled portion adjacent to the second tube end and an end portion which extends from the coiled portion towards the first tube end. The end portion is secured to the trailing end of the feeding member. When the end portion of the actuator is retracted towards the coiled portion, the feeder is moved along its length and its leading end moved through the tube magazine thereby to push the articles from the tube to the delivery station.

18 Claims, 6 Drawing Sheets

Fig. 8 ized cross section that conforms to the shape of the articles or components. The components are simply placed in the interior of the tube and the ends of the tube are closed during shipment. When the articles are placed in service, a feeding apparatus is used to feed the individual articles from one end of the tube to a delivery station. Some of the known types of feeding devices depend upon gravity to move the articles from the tube to the delivery station; see for example U.S. Pat. Nos. 4,718,531, 4,636,126, and 4,599,026. Other feeding devices hold the tube in a horizontal attitude and feed the articles from one end of the tube along a horizontal feed path to the delivery station by means of compressed air or a pushing device, see for example U.S. Pat. No. 4,862,578. U.S. application Ser. No. 651,671, filed Feb. 6 1991 describes a feeding apparatus in which the article feeder comprises a flexible steel tape which is moved through the tube by feed rolls which are rotated by an electric motor located at one end of the tube.

The present invention is directed to the achievement of a relatively simple feeding apparatus which uses a tape type feeder as described in U.S. application Ser. No. 07/651,671 but which has a relatively simple spring type actuator for moving the leading end of the tape into, and through, the tube.

THE INVENTION

The invention comprises a feeding apparatus for feeding articles, such as electrical components, from a tube to a delivery station. The tube contains a plurality of articles in side-by-side relationship and has first and second tube ends. The apparatus comprises a frame assembly having first and second locating means thereon for supporting the tube with the first and second tube ends adjacent to the first and second locating means respectively. The delivery station is adjacent to the first locating means. An elongated flexible feeding member having first and second feeding member ends is provided, the first feeding member end being located, at the beginning of an operating cycle, adjacent to the second locating means and in alignment with the second tube end of a tube which is supported on the frame assembly. The flexible feeding member extends away from the second tube end at the beginning of an operating cycle so that the second feeding member end is remote from the second locating means. The feeding member has a cross section which permits it to move axially through the tube. Guide means are provided for guiding the feeding member along a feeding member path. The guide means extends from the second locating means to the second feeding member end. Actuator means are provided for moving the feeding member along the feeding member path whereby upon placement of a tube on the frame assembly and movement of the feeding member along the feeding member path, the first feeding member end will move into the tube at the second tube end and will push the articles from the first tube end to the delivery station.

In accordance with the preferred embodiment, the guide means and feeding member path extend initially away from the second locating means and away from a tube supported on the frame assembly and then in the reverse direction back towards and past the second locating means and towards the first locating means. A portion of the feeding member path is beside, and parallel to, a tube supported on the frame assembly. In the preferred embodiment, the actuator means comprises an extensible spring on the frame assembly adjacent to the second locating means. The spring has a free end which is moved along a portion of the feeding member path toward the first locating means when the spring is extended. The second feeding member end is secured to the free end of the spring. Also in the preferred embodiment, the spring comprises a tape which is coiled adjacent to the second locating means and the feeding member also comprises a steel tape.

THE DISCLOSED EMBODIMENT

Figure 1:
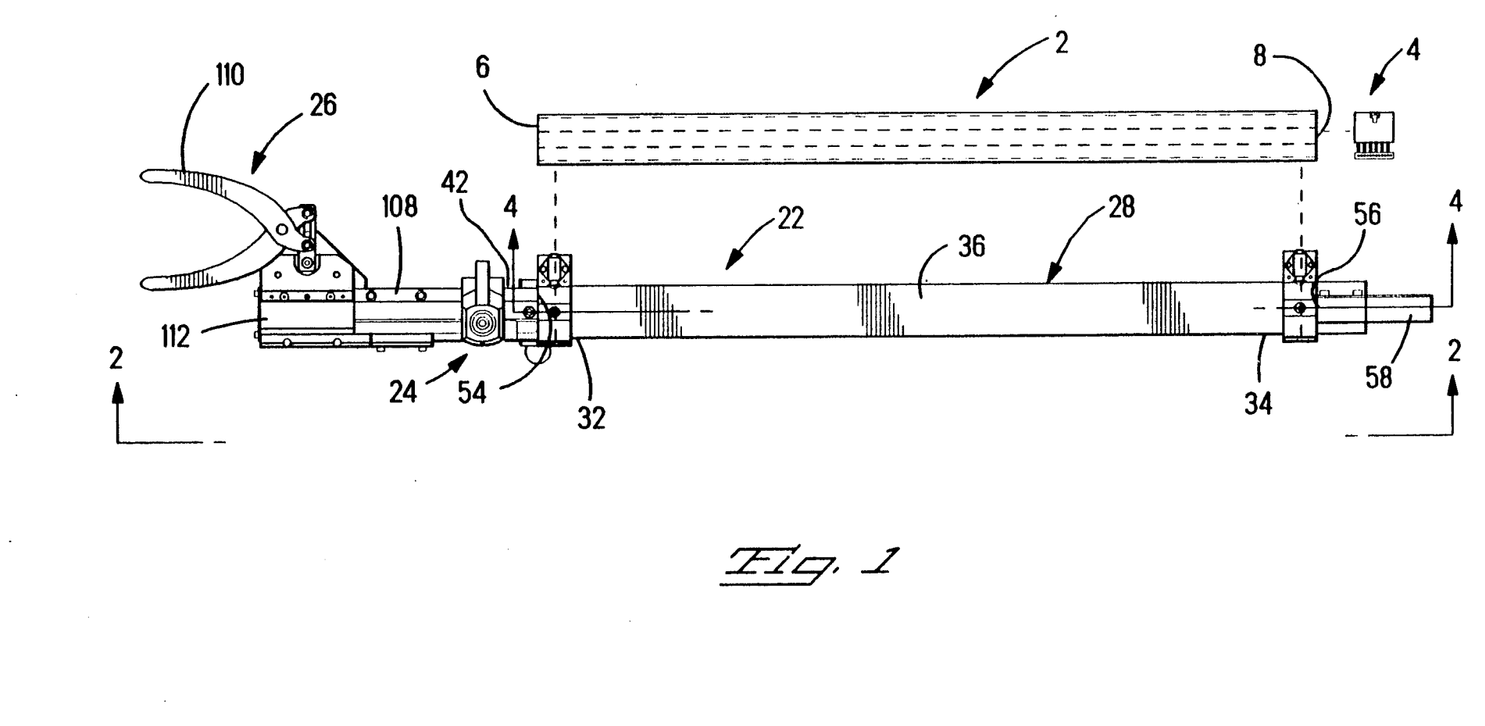
FIG. 1 is a top plan view of a feeding apparatus in accordance with the invention, and an applicator for attaching wires to terminals, and an inserter for inserting terminals into a connector housing.
Figure 3:
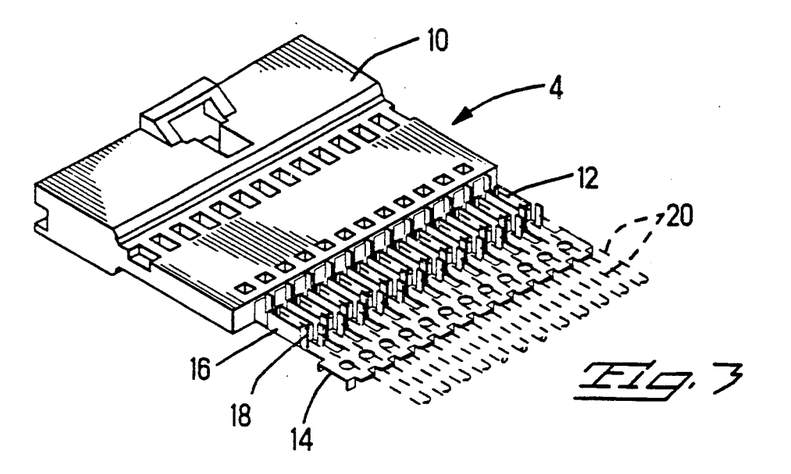
FIG. 3 is a view of a connector having terminals partially inserted into the cavities of the connector housing.

A typical tube magazine 2, FIG. 1, is intended to contain a plurality of connectors 4 which are stacked in side-by-side relationship between the first and second ends 6,8 of the tube. Each connector 4, FIG. 3, comprises an insulating connector body 10 having cavities extending therethrough and terminals 12. The terminals have contact portions which are inserted into the cavities and each terminal has a wire receiving portion 16 and a strain relief portion 18. Prior to installation of the connector 4 on wires 20, the terminals are only partially inserted into the cavities of the body 10 so that the portions 16,18 are outside of the body 10. The strain relief portions 18 are integral with a common carrier strip 14. When the connector is placed in service, wires 20 are inserted into the wire receiving portions of the terminals 16 and the strain relief portions are crimped onto the wires. Thereafter, the terminals are inserted completely into the connector body 10.

The tube feeder 22 shown in the drawing has an applicator 24 mounted thereon adjacent to its left-hand end as viewed in FIG. 1 and a terminal inserter 26 adjacent to the applicator. The present invention is concerned primarily with the feeder 22. The applicator 24 and inserter 26, will be described only briefly below.

Figure 2:
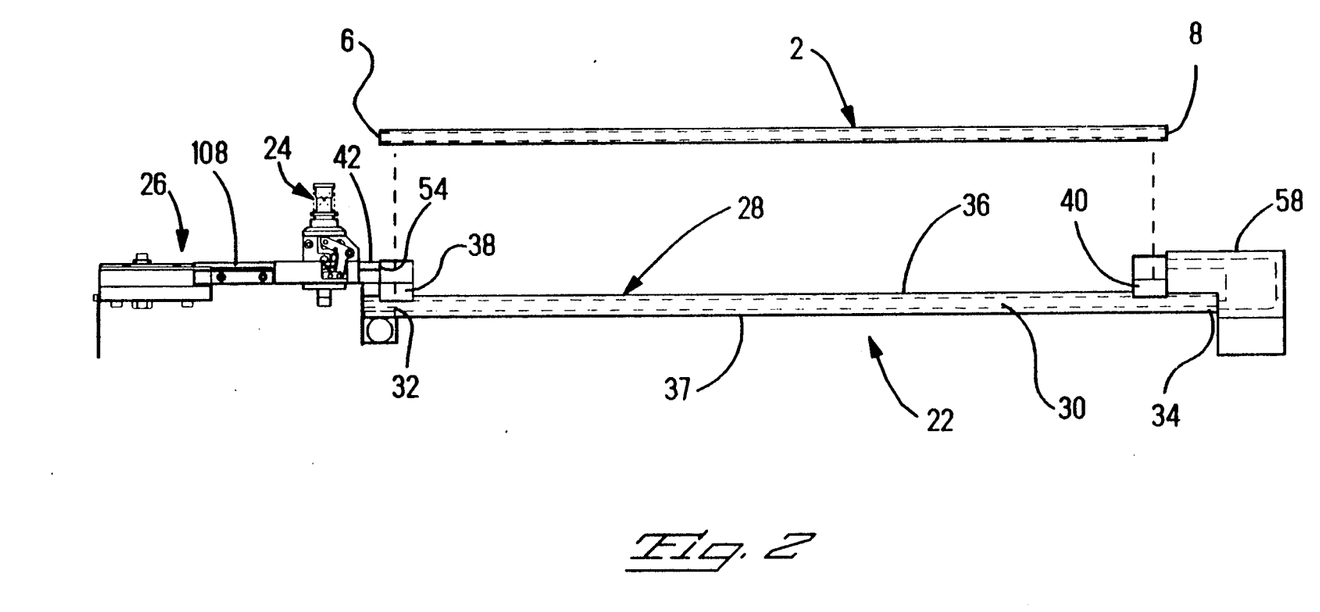
FIG. 2 is a frontal view of the apparatus looking in the direction of the arrows 2—2 of FIG. 1.

The tube feeder 22 comprises a frame assembly 28 which comprises an elongated hollow frame bar 30 having first and second ends 32,34. The frame bar has upwardly and downwardly facing major surfaces 36,37 as viewed in FIG. 2 and first and second mounting blocks 38,40 are mounted on the upper surface 36 adjacent to the first and second ends 32,34 respectively.

A discharge guide 42 is provided at the first end 32 for guiding connectors 4 discharged from the tube to the applicator 24 and an additional guide 108 is provided for guiding the connectors from the applicator 24 to the terminal insertion station 26.

Figure 5:
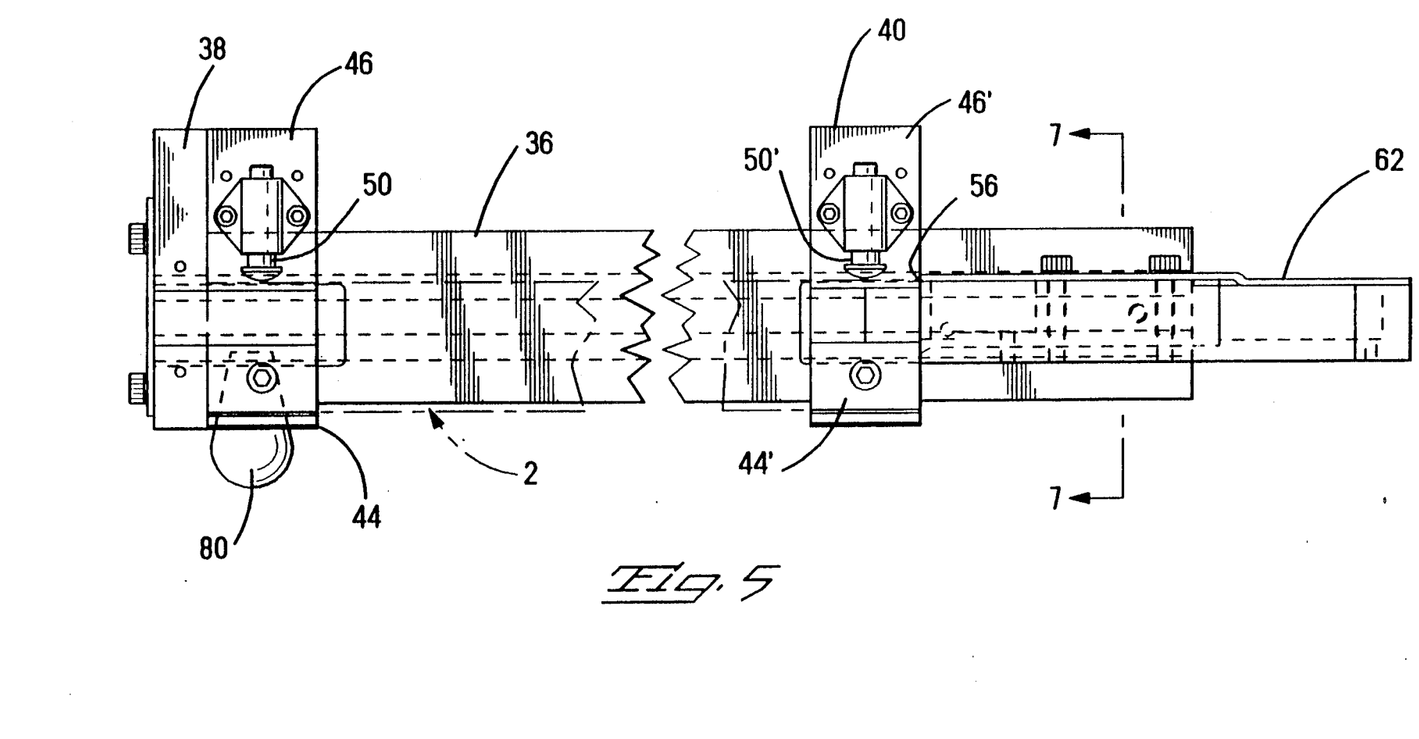
FIG. 5 is a top plan view on an enlarged scale of the feeder.
Figure 6:
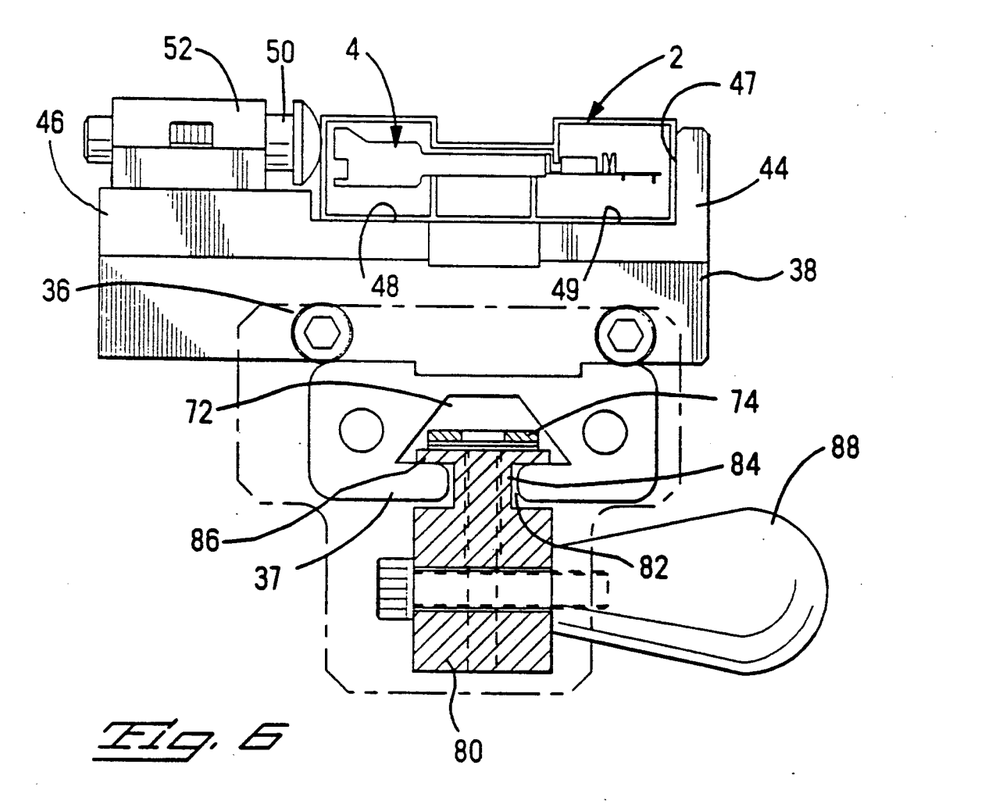
FIG. 6 is an end view looking in the direction of the arrows 6—6 of FIG. 4.
Figure 7:
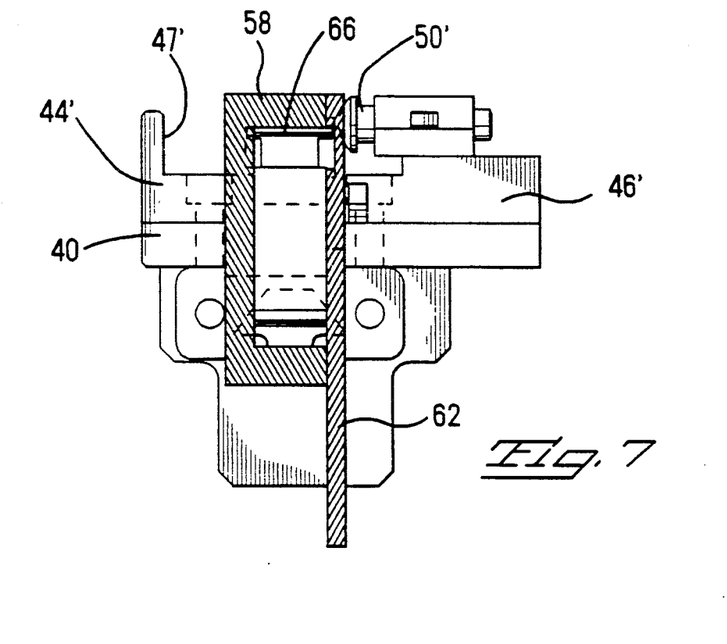
FIG. 7 is an end view looking in the direction of the arrows 7—7 of FIG. 5.

Referring to FIGS. 5 and 6, an angle bracket 44 is mounted on the upper surface of mounting block 38 and provides a leftwardly facing surface 47, as viewed in FIG. 6, which forms a stop for the right-hand side of a tube 2 supported in the frame assembly 28. A plate 46 is mounted on the left-hand side of mounting block 38 and has a surface 48 which supports the downwardly facing surface of the tube mounted in the frame assembly. The tube is also supported on the surface 49 of the bracket 44. The tube is held against the surface 47 by a plunger 50 which is contained in a housing 52 on plate 46 and is resiliently biased so that it will push the tube against the surface 47 of the angle bracket 44.

The block 40 has a similar angle bracket 44', a plate 46' and a plunger 50' thereon for resiliently biasing the tube against the upstanding arm of the bracket 44'. First and second locating stops 54,56 are provided for the first and second ends 6,8 of the tube. The first locating stop 54 is on the end of a discharge guide 42 which extends from the mounting block 38 to the applicator. The second locating stop 56 is on the end of a housing 58 which is mounted on the frame bar at the second end thereof.

The housing 58 has a cavity 59 therein which is located beyond the second end 34 of the frame bar 30 and a passageway 60 extends from this cavity to the stop 56. The side of the housing is covered by a side plate 62 that is secured to the housing by fasteners.

The connectors contained in the tube magazine are fed from the first end 6 thereof to the delivery station by a feeding member which comprises a flexible tape 66 having a leading end on which there is provided a pusher block 64. At the beginning of an operating cycle, the pusher block 64 will be located in passageway 60 adjacent to the stop surface 56 and the flexible steel tape will extend rightwardly as viewed in FIG. 4 through the passageway 60 into the cavity 59, around a guide pin 68 and then through a short passageway 70 which extends from the cavity 59 to the second end 34 of the frame bar 30. The passageway 70 is in alignment with the interior passageway 72 of the hollow frame bar 30. The flexible tape 66 has an intermediate portion which extends through the passageway 70 and through the frame bar passageway 72. Its trailing end is, at the beginning of an operating cycle, located adjacent to the first end 78 of the passageway 72 and is secured to a slide block 80.

The actuating means for moving the flexible feeding tape 66 comprises a spring tape 74 which has a coiled portion 76 that is contained in the cavity 59. An end portion of the tape extends from the coil through the passageway 72 parallel to, and beside, the feeding tape and the end of the spring tape is also secured to the block 80.

Figure 4:
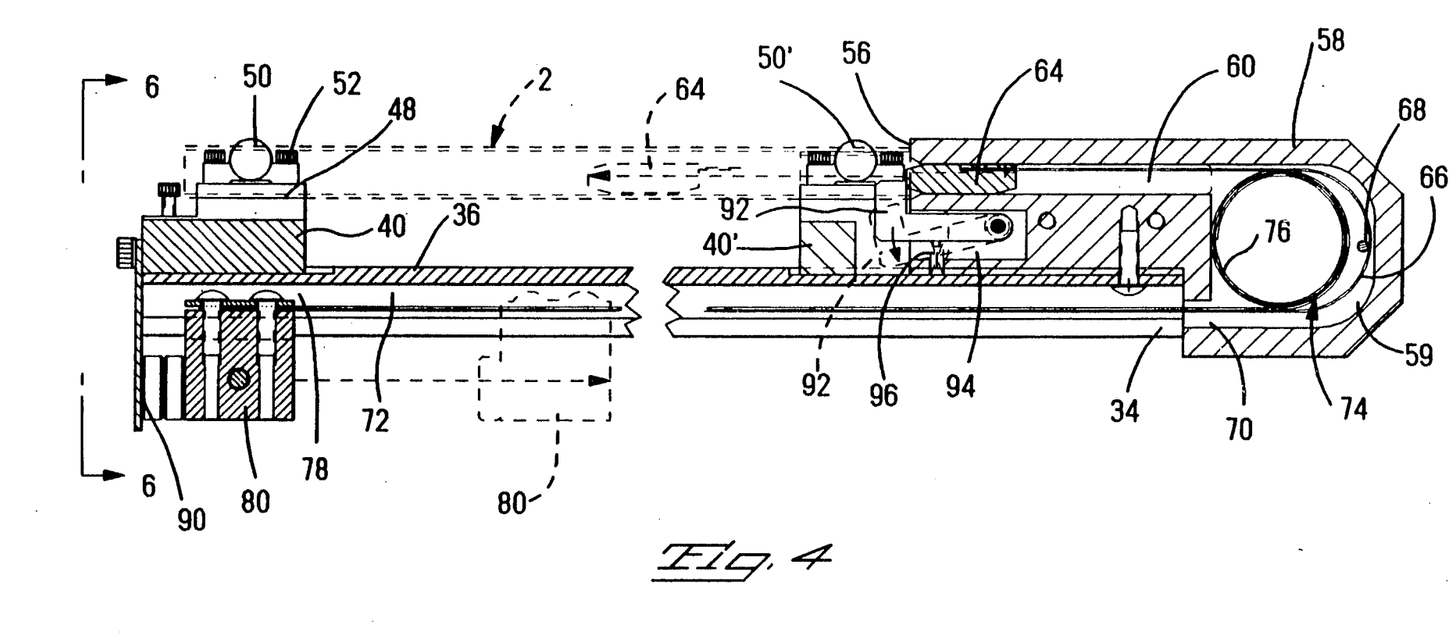
FIG. 4 is a sectional view, on an enlarged scale, looking in the direction of the arrows 4—4 of FIG. 1.

The slide block 80, FIGS. 4 and 6, has a neck portion 84 which extends upwardly and through a slot 82 in the underside 37 of the frame bar 30. The neck portion merges with a crown portion 86 of the block 80 which is dimensioned to be received in passageway 72 of the frame bar which, as shown in FIG. 6, has a trapezoidal cross section. A knob 88 is provided on the block 80 so that the operator can manipulate this spring actuator as will be described below. A magnet plate 90 is provided on the first end of the frame bar so that the metallic slide block 80 can be moved against this magnet to latch the slide block in the position shown in FIG. 4. A feeding member guide path for tape 66 is formed by passageway 60, pin 68, passageway 70, and the passageway 72 in bar 30. An extension path for spring 74 is formed by passageways 70,72.

The spring tape 74 and the feeding tape 66 are of the general type used for steel measuring tapes and need not be described in detail. Such tapes are of a medium carbon steel such as AISI 1095 and are formed with a camber. Steel tapes of this type are usually fully hardened to a Rockwell C hardness of 62 and the tempered until the hardness is in the range of 48-52. Tapes suitable for the practice of the invention are commercially available in widths of 6.3 mm and 12.7 mm. Under some circumstances, as where the components in tube magazine are relatively small, it is necessary to use a 6.3 mm tape and such tapes are entirely satisfactory for pushing small components which have a relatively low mass. Where larger components are involved the tube magazine will necessarily have greater inside dimensions and a 12.7 mm tape is used.

Prior to placement of a tube magazine on the frame assembly, the article pushing block 64 will be in the position of FIG. 4, and it is desirable to provide an L-shaped latch 92 for holding the block 64 in the position shown since it would otherwise move leftwardly under the influence of the spring tape. The latch 92 has an arm which extends beside the stop surface 56 and past the leading end of the pusher block 64. This latch is pivoted in a smaller cavity 94 which is below the passageway 60 and is resiliently biased as viewed in FIG. 4 in a clockwise direction by a spring 96. When the tube magazine is placed on the frame assembly, the latch is depressed and the pusher block will be in alignment with the stack of connectors in the passageway of the tube magazine.

Figure 8:
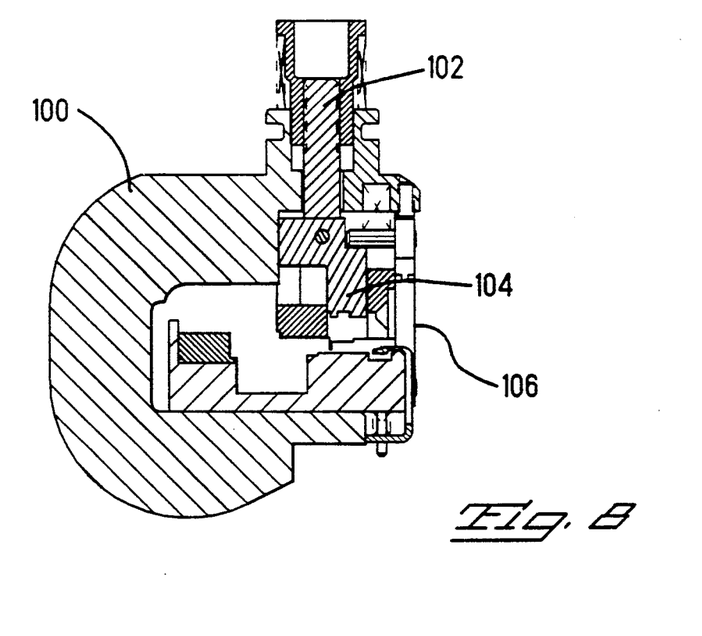
FIG. 8 is a sectional view, looking in the direction of the arrows 8—8 of FIG. 1.

The applicator 24, FIG. 8, may be of any desired type and need not be described in detail. The applicator shown has a C-shaped frame 100 in which a ram 102 is reciprocatively mounted. An insertion tool and a crimper 104 are mounted on the ram for inserting wires 20 into the terminals 12 and for crimping the terminals onto the wires. The applicator shown inserts a single wire into one of the terminals during each operating cycle. It is therefore necessary to provide an indexing mechanism 106 on the applicator for advancing the connector housing a distance equal to the spacing between adjacent cavities in the housing after each wire insertion operation. A guide track 108, similar to the guide track 42 extends from the applicator to the inserter. The inserter comprises a slide 112 which pushes the terminals fully into the cavities of the connector housing. The slide plate is in turn reciprocated by a cross handle mechanism 110.

The operation of the apparatus is as follows. Prior to placement of a tube magazine 2 in the frame assembly 28, the operator will have pulled the block 80 leftwardly and latched it against the magnet 90 on the first end 32 of the frame assembly. In doing so, the feeding tape 66 and the pusher 64 will be moved along the feed path in a reverse direction until the feeding block 64 is located as shown in FIG. 4. The end portion of the spring tape 72,74 will be pulled from the coil portion 76 and energy will be accumulated in the coil portion 76 of the tape 74 so that it will have a tendency to move the block 80 rightwardly from the position shown in FIG. 4.

When the operator places a filled tube magazine 2 on the frame assembly 28, the latch 92 is depressed and the connector pusher 64 is free to move leftwardly from the position of FIG. 4 through the tube. When the operator disengages the block 80 from the magnet 81, the coil spring 74 will tend to pull the block 80 rightwardly and thereby move the feeding tape 66 along a path which causes the pusher 64 to move leftwardly and into the tube magazine. The connector pusher 64 thereby pushes the articles from the first end of the tube to the applicator 24. The connectors are stopped at the applicator until the wires are inserted into the wire receiving portions 16 of the terminals 12 and the crimp portions 18 are crimped onto the wires.

After all of the connectors have been pushed from the first end of the tube, the operator grasps the block 80, which is adjacent to the housing 58 and at the rightward limit of its travel, and pulls it leftwardly to return (the parts) to the position of FIG. 4. The empty tube can then be removed from the frame assembly and a filled tube placed in the apparatus.

An advantage of the invention is that an extremely simple apparatus is provided for feeding connectors from a tube magazine which does not require electric motors or control systems. The feeder can be produced at a very low cost and is ideally suited for use where the volume of work involved does not justify a more complex automatic feeder. A further advantage is that the feeder can be operated by a technician with a minimum of training. Also, the feeder is very compact as a result of the use of the coiled spring tape actuator.

We claim:

1. A feeding apparatus for feeding articles from a tube to a delivery station, the tube containing a plurality of articles in side-by-side relationship, the tube having first and second tube ends, the apparatus comprising:

a frame assembly having first and second locating means thereon for supporting the tube with the first and second tube ends adjacent to the first and second locating means respectively, the delivery station being adjacent to the first locating means, an elongated flexible feeding member having first and second feeding member ends, the first feeding member end being located, at the beginning of an operating cycle, adjacent to the second locating means and in alignment with the second tube end of a tube which is supported on the frame assembly, the feeding member extending away from the second tube end at the beginning of an operating cycle so that the second feeding member end is remote from the second locating means, the feeding member having cross sectional dimensions which permit it to move axially through the tube, guide means for guiding the feeding member along a feeding member path, the guide means and the feeding member path extending initially away from the second locating means and away from a tube supported on the frame assembly and then in the reverse direction back towards, and past, the second locating means and towards the first locating means, a portion of the feeding member path being beside, and parallel to, a tube supported on the frame assembly, and actuator means for moving the feeding member along the feeding member path whereby, upon placement of a tube on the frame assembly and movement of the feeding member along the feeding member path, the first feeding member end will move into the tube at the second tube end and will push the articles from the first tube end to the delivery station.

2. A feeding apparatus as set forth in claim 1 characterized in that the actuator means comprises an extensible spring on the frame assembly adjacent to the second locating means, the spring having a free end which is moved along a portion of the feeding member path towards the first locating means upon extension of the spring, the second feeding member end being secured to the free end of the spring.

3. A feeding apparatus as set forth in claim 2 characterized in that the feeding member path extends from the second locating means past the spring then in the reverse direction around, and again past, the spring towards the first locating means.

4. A feeding apparatus as set forth in claim 3 characterized in that the feeding member comprises a flexible feeding member tape and the extensible spring comprises a flexible spring tape, the spring tape having a coiled portion which is located adjacent to the second locating means, the free end extending from the coiled portion.

5. A feeding apparatus as set forth in claim 3 characterized in that the feeding member comprises a flexible feeding member tape.

6. A feeding apparatus as set forth in claim 3 characterized in that the extensible spring comprises a flexible spring tape, the spring tape having a coiled portion which is located adjacent to the second locating means, the free end extending from the coiled portion.

7. A feeding apparatus for feeding articles from a tube to a delivery station, the tube containing a plurality of articles in side-by-side relationship, the tube having first and second tube ends, the apparatus comprising:

a frame assembly having first and second locating means thereon for supporting the tube with the first and second tube ends adjacent to the first and second locating means respectively, the delivery station being adjacent to the first locating means, an extensible spring on the frame assembly proximate to the second locating means, the spring having a free end and being extensible along a spring extension path which extends toward the first locating means, the free end being moved along the extension path when the spring is extended, an elongated flexible feeding member having first and second feeding member ends, the second feeding member end being secured to the free end of the spring, the first feeding member end comprising an article pusher, the feeding member having cross sectional dimensions which permit it to move through the tube, and guide means on the frame assembly for guiding the spring and the feeding member along the extension path and for guiding the feeding member along a feeding member guide path, the feeding member guide path extending from the extension path to the second locating means and through a tube supported on the frame assembly whereby, upon extension of the spring and placement of the tube on the frame assembly, the first feeding member end will be located adjacent to, and in alignment with, the tube at the second tube end, and as the free end of the spring is retracted towards the second locating means, the spring will move the feeding member along the feeding member guide path so that the first feeding member end will move into the second tube end and through the tube towards the first tube end thereby to feed the articles from the first tube end to the delivery station.

8. A feeding apparatus as set forth in claim 7 characterized in that the feeding member guide path extends past the second locating means, past the spring, and then in the reverse direction.

9. A feeding apparatus as set forth in claim 8 characterized in that the feeding member comprises a flexible tape which is supported on the extension path and on the guide path by the guide means.

10. A feeding apparatus as set forth in claim 9 characterized in that the spring comprises a coiled steel tape which is partially uncoiled when the free end is moved along the extension path.

11. A feeding apparatus as set forth in claim 7 characterized in that the frame assembly comprises an elongated hollow bar, the spring extension path being in the interior of the bar.

12. A feeding apparatus as set forth in claim 11 characterized in that the spring is contained in a spring housing which is mounted on the bar adjacent to the second locating means, the feeding member guide path comprising the interior of the bar and portions of the spring housing.

13. A feeding apparatus as set forth in claim 12 characterized in that the spring comprises a steel tape which has a coiled portion and an extensible and contractible end portion extending from the coiled portion, the coiled portion being contained in the spring housing, the end portion extending into the interior of the bar.

14. A feeding apparatus as set forth in claim 13 characterized in that the feeding member comprises a feeding member tape.

15. A feeding apparatus as set forth in claim 7 characterized in that the frame assembly comprises an elongated hollow frame bar and a spring housing on the bar adjacent to the second locating means, the spring comprises a spring tape having a coiled portion and an end portion, the coiled portion being in the spring housing, the end portion extending from the coiled portion into the interior of the bar, and the feeding member comprises a feeding member tape.

16. A feeding apparatus as set forth in claim 15 characterized in that a slide block is provided, the frame bar has a slot extending between the first and second locating means, the slide block having a neck portion which extends through the slot and into the interior of the frame bar, the free end of the spring and the second feeding member end being fixed to the neck portion, the slide block being movable from a location adjacent to the second locating means to a location adjacent to the first locating means thereby to locate the first feeding member end adjacent to the second locating means and store energy in the coiled portion of the spring.

17. A feeding apparatus as set forth in claim 16 characterized in that an applicator is provided for attaching wires to terminals in electrical connectors, the applicator being adjacent to the delivery station and in alignment with the feeding member guide path whereby connectors fed from the tube are delivered to the applicator.

18. A feeding apparatus as set forth in claim 17 characterized in that a guide track is provided which extends from the frame bar to the applicator for guiding connectors from the tube to the applicator, the first locating means being one end of the guide track, the second locating means being on the spring housing.

* * * * *